(12) United States Patent
Nieh et al.

(10) Patent No.: US 8,163,583 B2
(45) Date of Patent: Apr. 24, 2012

(54) MANUFACTURING METHOD OF MICRO ELECTRONIC MECHANICAL SYSTEM STRUCTURE

(75) Inventors: Tsai-Chiang Nieh, Hsinchu County (TW); Tung-Ming Lai, Hsinchu (TW); Feng-Tsai Tsai, Tainan (TW)

(73) Assignee: Maxchip Electronics Corp., Hsinchu (TW)

( * ) Notice: Subject to any disclaimer, the term of this patent is extended or adjusted under 35 U.S.C. 154(b) by 190 days.

(21) Appl. No.: 12/721,546

(22) Filed: Mar. 10, 2010

(65) Prior Publication Data

US 2011/0169106 A1 Jul. 14, 2011

(30) Foreign Application Priority Data

Jan. 12, 2010 (TW) ................................ 99100680 A

(51) Int. Cl.
*H01L 21/467* (2006.01)
(52) U.S. Cl. .......... 438/50; 438/684; 438/700; 438/737; 257/E21.587
(58) Field of Classification Search ............ 257/E21.587
See application file for complete search history.

(56) References Cited

U.S. PATENT DOCUMENTS

| 5,919,548 | A | * | 7/1999 | Barron et al. ................. 428/138 |
| 7,303,936 | B2 | * | 12/2007 | Chilcott .......................... 438/50 |
| 7,629,264 | B2 | * | 12/2009 | Bonilla et al. ................ 438/739 |
| 7,943,525 | B2 | * | 5/2011 | Zhang et al. .................. 438/738 |

* cited by examiner

*Primary Examiner* — Stephen W Smoot
(74) *Attorney, Agent, or Firm* — Jianq Chyun IP Office

(57) ABSTRACT

A micro electronic mechanical system structure and a manufacturing method thereof are provided. A substrate has a plurality of conductive regions is provided. A dielectric layer is formed on the substrate. A plurality of openings and recesses are formed in the dielectric layer, wherein the openings expose the conductive regions. The recesses are located between the openings. A conductive layer is formed on the dielectric layer and the openings and the recesses are filled with the conductive layer. The conductive layer is patterned to form a plurality of strips of the first conductive patterns on the dielectric layer and a second conductive pattern on the sidewall and the bottom of each recess, wherein the first conductive patterns are connected with each other through the second conductive patterns. The dielectric layer is removed. The second conductive patterns between the first conductive patterns are removed.

20 Claims, 6 Drawing Sheets

MANUFACTURING METHOD OF MICRO ELECTRONIC MECHANICAL SYSTEM STRUCTURE

CROSS-REFERENCE TO RELATED APPLICATION

This application claims the priority benefit of Taiwan application serial no. 99100680, filed on Jan. 12, 2010. The entirety of the above-mentioned patent application is hereby incorporated by reference herein and made a part of specification.

BACKGROUND OF THE INVENTION

1. Field of the Invention

The invention relates to the micro electronic mechanical system (MEMS) structure and the manufacturing method thereof, especially to, the micro electronic mechanical system structure and the manufacturing method thereof which prevent the stiction of the conductive layer.

2. Description of Related Art

With continuously improving technology, nowadays, various micro electronic mechanical system devices can be manufactured by micro-manufacturing technology. For example, these micro electronic mechanical system devices include motors, pumps, valves, switches, sensors, pixels, microphones and so on.

Generally, during the manufacture of the micro electronic mechanical system, a dielectric layer is formed on the substrate first. Then, a plurality of conductive patterns are formed on the substrate, and contact windows are formed in the dielectric layer to electrically connect the conductive patterns and the circuit on the substrate and to provide the support for the conductive patterns. Next, a wet etching process is performed to remove the dielectric layer.

However, during removing the dielectric layer by the wet etching process, the stiction may occur to the conductive patterns due to the surface tension of the etching solution. That is, the conductive patterns adhere to the film layer below, and the conductive patterns adhere to each other such that the micro electronic mechanical system fails.

SUMMARY OF THE INVENTION

The invention provides a method of manufacturing the micro electronic mechanical system structure which prevents the conductive patterns from adhering to each other during the manufacturing process.

The invention also provides a method of manufacturing the micro electronic mechanical system structure which fixes the conductive patterns to prevent the conductive patterns from adhering to each other during the wet etching process.

The invention also provides a micro electronic mechanical system structure which prevents the downward stiction of the conductive patterns.

The invention provides a method of manufacturing the micro electronic mechanical system structure. First, a substrate is provided. The substrate has a plurality of conductive regions. Then, a dielectric layer is formed on the substrate. Then, a plurality of openings and a plurality of recesses are formed in the dielectric layer, wherein the openings expose the conductive regions, and the recesses are located between the openings. Next, a conductive layer is formed on the dielectric layer. The openings and the recesses are filled with the conductive layer. In addition, the conductive layer is patterned to form a plurality of strips of first conductive patterns on the dielectric layer and to form second conductive patterns on a sidewall and a bottom of each of the recesses, wherein the first conductive patterns are connected with each other through the second conductive patterns. The dielectric layer is then removed. After that, the second conductive patterns between the first conductive patterns are removed.

According to the method of manufacturing the micro electronic mechanical system structure described in the embodiment of the invention, the step of patterning the conductive layer may be forming a hard mask layer on the conductive layer first, wherein the hard mask layer at least covers a portion of the conductive layer located in the recesses. Then, an etching process is performed with the hard mask layer as the mask. After that, the hard mask layer is removed.

According to the method of manufacturing the micro electronic mechanical system structure described in the embodiment of the invention, the step of removing the dielectric layer may be the wet etching process.

According to the method of manufacturing the micro electronic mechanical system structure described in the embodiment of the invention, the step of removing the second conductive patterns between the first conductive patterns may be the dry etching process.

According to the method of manufacturing the micro electronic mechanical system structure described in the embodiment of the invention, the material of the conductive layer comprises doped poly-silicon.

According to the method of manufacturing the micro electronic mechanical system structure described in the embodiment of the invention, the material of the dielectric layer comprises oxide.

According to the method of manufacturing the micro electronic mechanical system structure described in the embodiment of the invention, before forming the dielectric layer, the method further comprises forming the passivation layer on the substrate.

According to the method of manufacturing the micro electronic mechanical system structure described in the embodiment of the invention, the material of the passivation layer comprises nitride.

The invention also provides a method of manufacturing the micro electronic mechanical system structure. First, a substrate is provided in the method. The substrate has a plurality of conductive regions. Then, a dielectric layer is formed on the substrate. Then, a plurality of openings and a trench are formed in the dielectric layer, wherein the openings expose the conductive regions, and the trench is located between the openings. After that, a connective layer is formed in the trench. Next, a conductive layer is formed on the dielectric layer and the connective layer, and the openings are filled with the conductive layer. Then, the conductive layer is patterned to form a plurality of strips of conductive patterns on the dielectric layer and the connective layer, wherein the conductive patterns are connected with each other through the connective layer. Next, the dielectric layer is removed. Then, the connective layer between the first conductive patterns is removed.

According to the method of manufacturing the micro electronic mechanical system structure described in the embodiment of the invention, the material of the connective layer is different from the material of the dielectric layer.

According to the method of manufacturing the micro electronic mechanical system structure described in the embodiment of the invention, the material of the connective layer may be the insulation material or the conductive material.

According to the method of manufacturing the micro electronic mechanical system structure described in the embodiment of the invention, the material of the connective layer may be silicon nitride, silicon carbide or poly-silicon.

According to the method of manufacturing the micro electronic mechanical system structure described in the embodiment of the invention, wherein the material of the connective layer is identical to the material of the conductive layer, and the step of forming the connective layer and the step of forming the conductive layer are performed simultaneously.

According to the method of manufacturing the micro electronic mechanical system structure described in the embodiment of the invention, the trench may extend from the surrounding of one of the openings to the surrounding of another one of the openings.

According to the method of manufacturing the micro electronic mechanical system structure described in the embodiment of the invention, the step of removing the connective layer between the first conductive patterns may be the dry etching process.

The invention provides a micro electronic mechanical system structure which comprises a substrate, a plurality of strips of conductive patterns arranged in parallel, a plurality of contact windows and a plurality of protrusion portions. The substrate has a plurality of conductive regions. The conductive patterns are disposed on the substrate. The contact windows are disposed between the conductive patterns and the substrate to electrically connect the conductive patterns and the conductive regions. The protrusion portions are disposed under the conductive patterns and located between the contact windows, and the protrusion portions are connected with the conductive patterns.

According to the micro electronic mechanical system structure described in the embodiment of the invention, the protrusion portions may be located at the edge of each of the conductive patterns.

According to the micro electronic mechanical system structure described in the embodiment of the invention, the material of the protrusion portions is identical to the material of the conductive patterns.

According to the micro electronic mechanical system structure described in the embodiment of the invention, a portion of the protrusion portions is located at the edge of a portion of the conductive patterns, and another portion of the protrusion portions extends from one end of another portion of the conductive patterns to another end.

Due to the above, in the invention, the first conductive patterns are connected with each other through the second conductive patterns to fix the distance between the first conductive patterns. Therefore, when the wet etching is used for removing the dielectric layer, the fixed first conductive patterns may sustain the surface tension of the etching solution without the stiction among the first conductive patterns.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
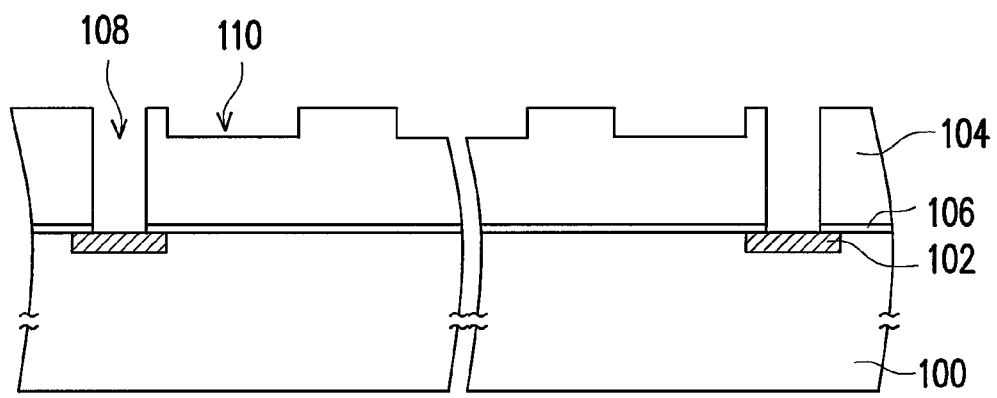
FIGS. 1A through 1E are the schematics of the cross-sectional views illustrating a manufacturing flow of a micro electronic mechanical system structure according to an embodiment of the invention.

FIGS. 1A through 1E are cross-sectional views illustrating manufacturing flow of a micro electronic mechanical system structure according to an embodiment of the invention. First, referring to FIG. 1A, the substrate 100 is provided. The substrate 100 is, for example, the insulation substrate and may be the dielectric substrate or silicon oxide substrate. Alternatively, the substrate 100 may be the isolation structure, such as the shallow trench isolation structure. The conductive regions 102 are formed in the substrate 100. The conductive regions 102 may be a conductive wire, an electrode or a doped region. Next, a dielectric layer 104 is formed on the substrate 100. The material of the dielectric layer 104 may be oxide. The dielectric layer 104 may be formed by the chemical vapor deposition (CVD). The thickness of the dielectric layer 104 may be about 2 µm to 3 µm. In addition, before the dielectric layer 104 is formed, the passivation layer 106 is formed on the substrate 100. The material of the passivation layer 106 may be nitride. The passivation layer 106 may be formed by the CVD. The passivation layer 106 can prevent the substrate 100 from being damaged in the following process. Next, the openings 108 and the recesses 110 are formed in the dielectric layer 104. The openings 108 pass through the dielectric layer 104 and the passivation layer 106 to expose the conductive region 102. The recesses 110 are located between the openings 108. The width of the recesses 110 is greater than the gap width between the conductive patterns 112a (shown in FIG. 1B) to be formed later. In addition, the bottom of the recesses 110 still has the dielectric layer 104. In other word, the depth of the recesses 110 is less than the depth of the openings 108. The depth of the recesses 110 may be about 0.5 µm to 1.5 µm. The method of forming openings 108 and the recesses 110 may be performing a known photolithography-and-etching process which is not described herein.

Figure 1B:
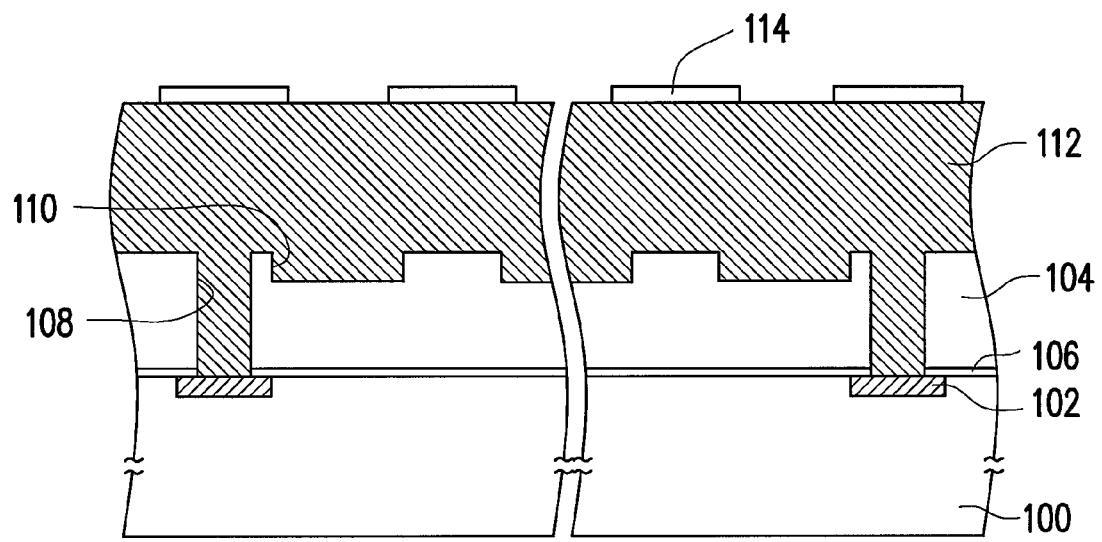

Next, referring to FIG. 1B, a conductive layer 112 is formed on the dielectric layer 104, and the openings 108 and the recesses 110 are filled with the conductive layer 112. The material of the conductive layer 112 is, for example, doped poly-silicon formed by the CVD and the in-situ doping. The thickness of the conductive layer 112 is about 4 µm to 8 µm. Then, a hard mask layer 114 is selectively formed on the conductive layer 112. The material of the hard mask layer 114 is, for example, the insulation material (such as silicon nitride). The hard mask layer 114 may be formed by the plasma enhanced CVD, and the thickness of the hard mask layer 114 is about 500 Å to 1500 Å. The hard mask layer 114 at least covers a portion of the conductive layer 112 located in the recesses 110.

Figure 1C:
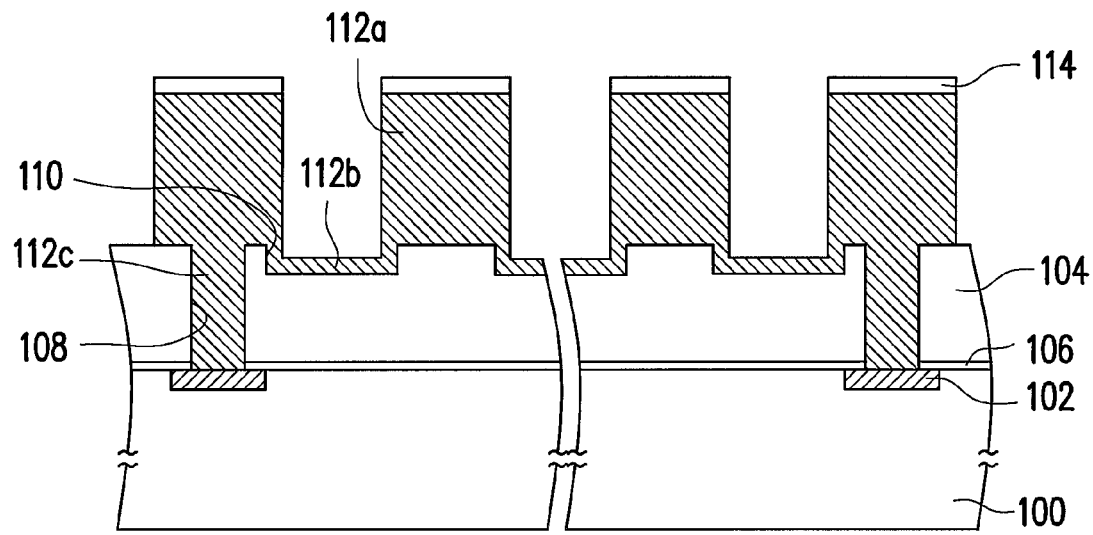

Next, referring to FIG. 1C, the conductive layer 112 is patterned to form the strips of conductive patterns 112a on the dielectric layer 104 and to form the conductive pattern 112b in each of the recesses 110. The method of patterning the conductive layer 112 may be performing an etching process with the hard mask layer 114 as the mask. To be more specific, after the step of the patterning, the conductive layer 112 forms the conductive patterns 112a, 112b and the contact windows 112c located in the openings 108. The conductive patterns 112a are connected with each other through the conductive patterns 112b, and electrically connected with the conductive region 102 through the contact windows 112c.

Figure 1D:
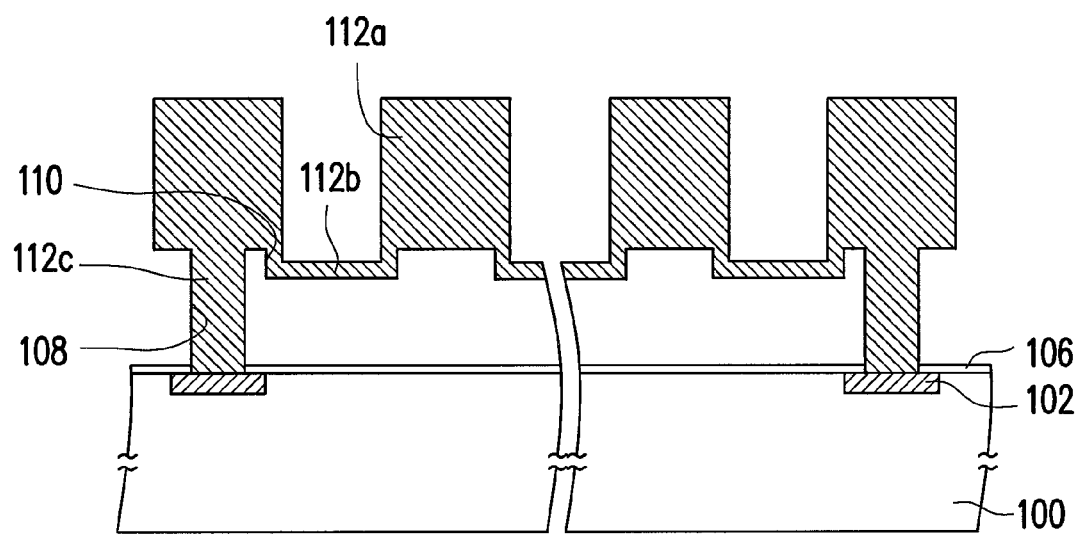

Next, referring to FIG. 1D, the dielectric layer 104 is removed. The method of removing the dielectric layer 104 is, for example, the wet etching process. If the material of the hard mask layer 114 is identical to the material of the dielectric layer, the hard mask layer 114 may be removed together in the step. In addition, since the passivation layer 106 is formed on the substrate 100, the substrate 100 is prevented from being damaged during the process of removing the dielectric layer 104. It is noted that, since the conductive patterns 112a are connected with each other through the conductive patterns 112b and the distance between the conductive patterns 112a is fixed, when the dielectric layer 104 is removed by the wet etching process, the conductive patterns 112a is prevented from adhering to each other.

Figure 2:
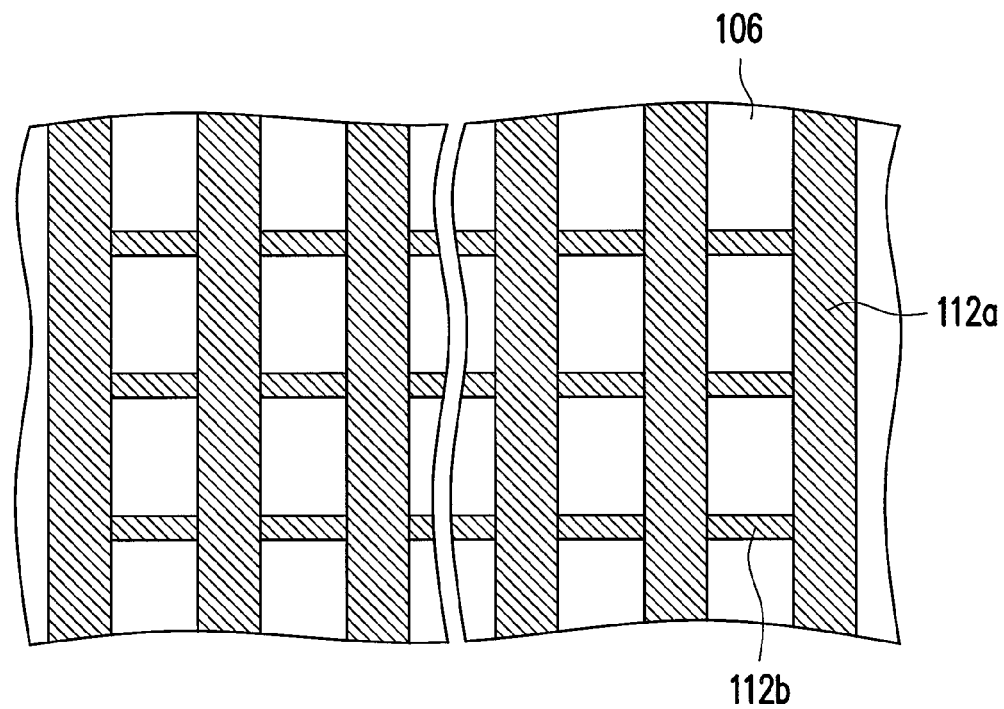
FIG. 2 is the schematic of the top view illustrating a structure in FIG. 1D.

For clarification, the description is made for further illustration of FIG. 1D with reference to the schematic of the top view. FIG. 2 is the schematic of the top view illustrating a structure in FIG. 1D. In the conventional technology, since the conductive patterns 112b does not exist between the conductive patterns 112a, during the wet etching process, the stiction may easily occur between the conductive patterns 112a due to the surface tension of the etching solution. However, in the embodiment, since the conductive patterns 112a are connected with each other through the conductive patterns 112b and the distance between the conductive patterns 112a is fixed, the conductive patterns 112a are not connected with each other such that the stiction may not occur. In FIG. 2, the extending direction of the conductive patterns 112a is perpendicular to the extending direction of the conductive patterns 112b, but not limited thereto in other embodiment. The extending direction of the conductive patterns 112a may be interlaced with but not perpendicular to the extending direction of the conductive patterns 112b.

After that, the conductive patterns 112b between the conductive patterns 112a are removed. The method of removing the conductive patterns 112b may be the dry etching process. Since the dry etching process is used when removing the conductive patterns 112b between the conductive patterns 112a, a portion of the conductive patterns 112b remains under the conductive patterns 112a. However, since each of the conductive patterns 112b is only connected with each of the conductive patterns 112b, the practical operation of the devices may not be affected. In addition, the portion of the conductive patterns 112b remaining under the conductive patterns 112a prevents the downward stiction of the conductive patterns 112a. That is to say, the invention prevents the lateral stiction and the perpendicular stiction of the conductive patterns 112a simultaneously.

It is noted that, if the micro electronic mechanical system structure is formed in the peripheral region of the substrate, the steps described in FIG. 1A through 1E may be integrated with the process of the active device region without additional process steps. For example, the process of the micro electronic mechanical system structure may be integrated into the interconnection structure process.

FIGS. 3A through 3E are the schematics of the cross-sectional views illustrating a manufacturing flow of a micro electronic mechanical system structure according to another embodiment of the invention. In FIGS. 3A through 3E, the same reference numbers are used to refer to the same parts in FIGS. 1A through 1E. Same descriptions are as well omitted.

Figure 3A:
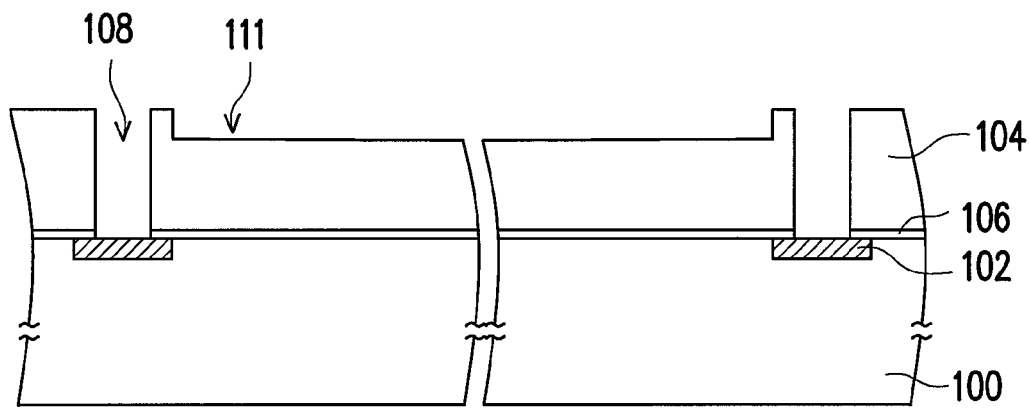
FIGS. 3A through 3E are the schematics of the cross-sectional views illustrating a manufacturing flow of a micro electronic mechanical system structure according to another embodiment of the invention.

First, referring to FIG. 3A, the substrate 100 is provided. The conductive regions 102 are formed in the substrate 100. Next, a dielectric layer 104 is formed on the substrate 100. In addition, before the dielectric layer 104 is formed, a passivation layer 106 is selectively formed on the substrate 100 to prevent the substrate 100 from being damaged in the following process. Next, the openings 108 and the trench 111 are formed in the dielectric layer 104. The openings 108 pass through the dielectric layer 104 and the passivation layer 106 to expose the conductive region 102. The trench 111 is located between the openings 108. The bottom of the trench 111 still has the dielectric layer 104. In other word, the depth of the trench 111 is less than the depth of the openings 108. The depth of the trench 111 may be about 0.5 µm to 1.5 µm. The trench 111 may extend from the surrounding of one opening 108 to the surrounding of another opening 108.

Figure 3B:
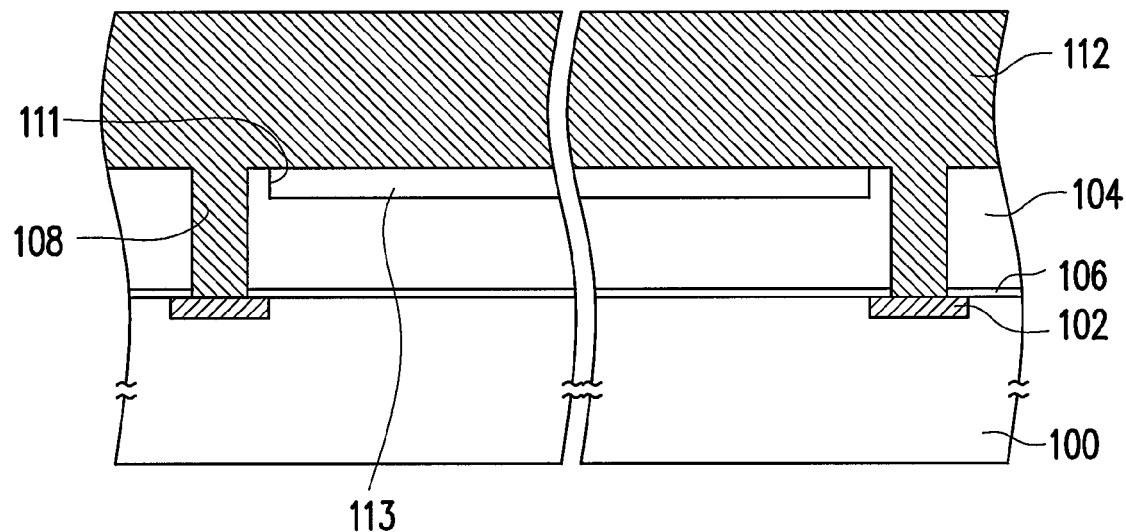

Then, referring FIG. 3B, a connective layer 113 is formed in the trench 111. It is noted that the connective layer 113 and the dielectric layer 104 need to have different etching selectivities. That is to say, the material of the connective layer 113 is different from the material of the dielectric layer 104. Furthermore, during the removal of the dielectric layer 104 by the etching process afterward, the etching rate of the connective layer 113 needs to be less than the etching rate of the dielectric layer 104 to prevent the connective layer 113 from being removed together. The material of the connective layer 113 may be the insulation material or the conductive material, such as silicon nitride, silicon carbide or poly-silicon. The method of forming the connective layer 113 may be first forming the connective material layer on the dielectric layer 104 by the CVD process, then performing the planarization process or the etch-back process to remove the connective material layer outside the trench 111. After the connective layer 113 is formed, a conductive layer 112 is formed on the dielectric layer 104 and the connective layer 113, and the openings 108 are filled with the conductive layer 112.

It is noted that if the material of the connective layer 113 is identical to the material of the conductive layer 112, the connective layer 113 and the conductive layer 112 may be formed simultaneously.

Figure 3C:
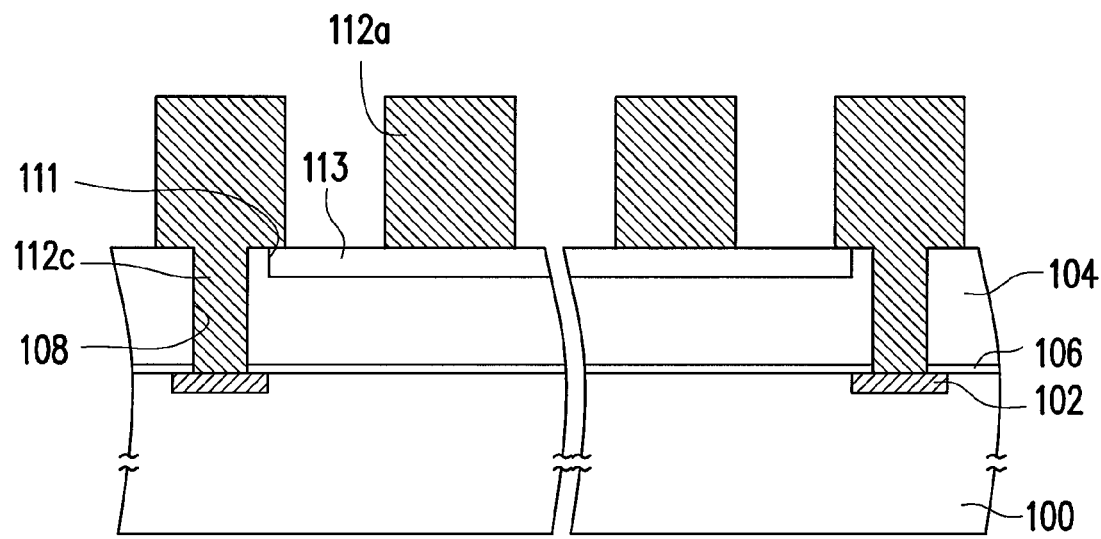

Next, referring to FIG. 3C, the conductive layer 112 is patterned to form the strips of conductive patterns 112a on the dielectric layer 104 and the connective layer 113, and to form the contact windows 112c in the openings 108 for electrically connecting the conductive regions 102 and a portion of the conductive patterns 112a. In addition, in the embodiment, the conductive patterns 112a are connected with each other through the connective layer 113.

Figure 3D:
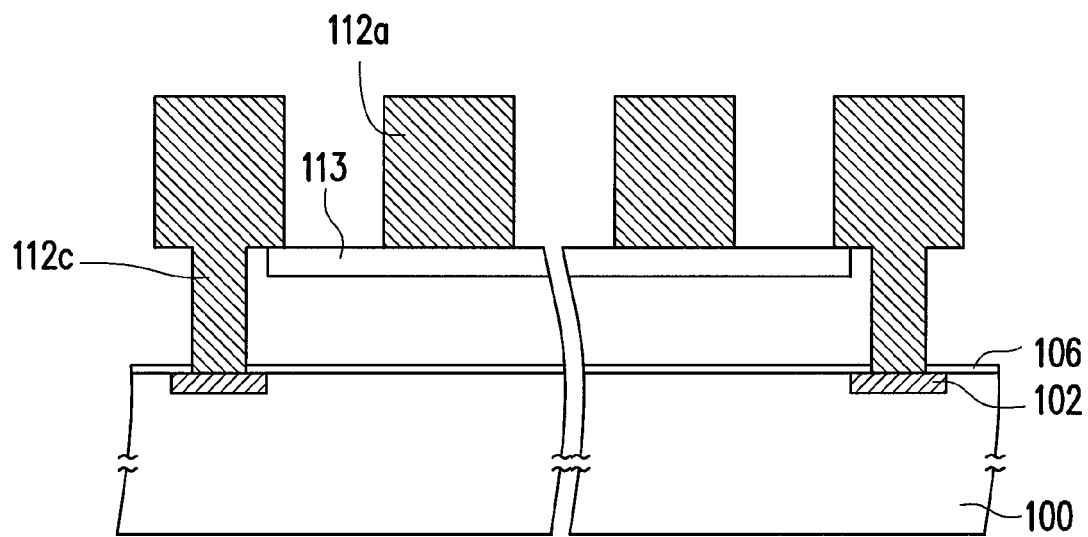

Next, referring to FIG. 3D, the dielectric layer 104 is removed. Since the conductive patterns 112a are connected with each other through the connective layer 113 and the distance between the conductive patterns 112a is fixed, when the dielectric layer 104 is removed by the wet etching process, the conductive patterns 112a is prevented from adhering to each other due to the surface tension of the etching solution.

Then, the connective layer 113 between the conductive patterns 112a is removed. The method of removing the connective layer 113 is, for example, the dry etching process. Since the dry etching process is used when removing the connective layer 113 between the conductive patterns 112a, a portion of the connective layer 113 remains under the conductive patterns 112a. However, after performing the dry etching process, since the connective layer 113 is only connected with each of the conductive patterns 112a, the practical operation of the devices may not be affected. In addition, the portion of the connective layer 113 remaining under the conductive patterns 112a may prevent the downward stiction of the conductive patterns 112a. That is to say, the invention prevents the lateral stiction and the perpendicular stiction of the conductive patterns 112a simultaneously.

The micro electronic mechanical system structure of the invention is described with reference to FIG. 1E and FIG. 3E in the following.

Figure 1E:
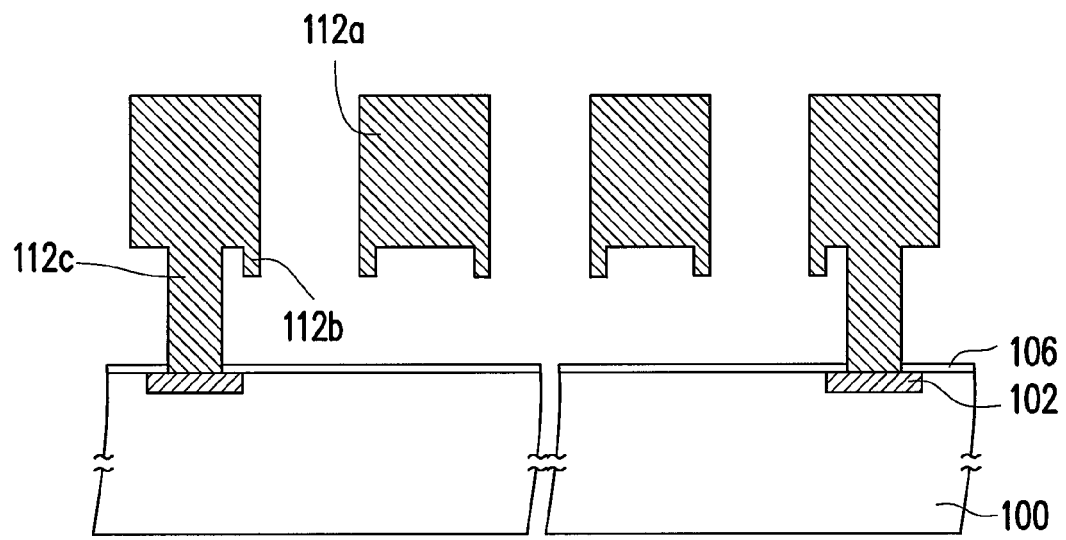
Figure 3E:
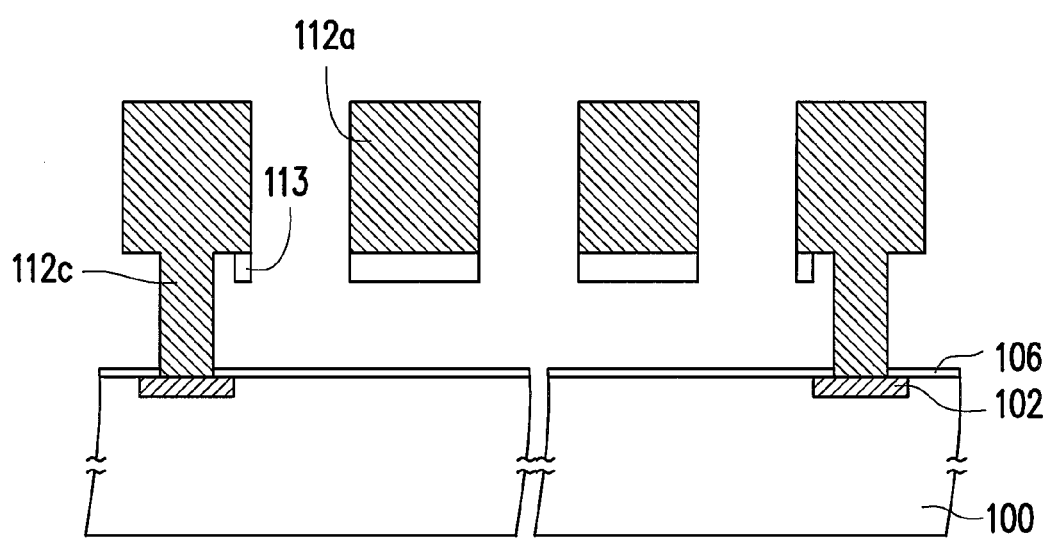

Referring to FIG. 1E and FIG. 3E, the micro electronic mechanical system structure of the invention includes a substrate 100, conductive patterns 112a arranged in parallel, contact windows 112c and protrusion portions. The conductive regions 102 are formed in the substrate 100. The conductive patterns 112a are disposed on the substrate 100. The contact windows 112c are disposed between the conductive patterns 112a and the substrate 100 to electrically connect the conductive patterns 112a and the conductive regions 102. The protrusion portions are disposed under the conductive patterns 112a and located between the contact windows 112c, and the protrusion portions are connected with the conductive patterns 112a.

The protrusion portions are further described below. In an embodiment (shown in FIG. 1E), the protrusion portions (the conductive patterns 112b) may be located at the edge of each of the strips of the conductive patterns 112a, and the material of the protrusion portions is identical to the material of the conductive patterns 112a. In another embodiment (shown in FIG. 3E), a portion of the protrusion portions is located at the edge of a portion of the conductive patterns 112a, and another portion of the protrusion portions extends from one end of another portion of the conductive patterns 112a to another end (the protrusion portions are the connective layer 113). In the embodiments, the portion of the protrusion portions disposed under the conductive patterns 112a may prevent the downward stiction of the conductive patterns 112a.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of manufacturing a micro electronic mechanical system structure, comprising:
   providing a substrate, wherein the substrate has a plurality of conductive regions;
   forming a dielectric layer on the substrate;
   forming a plurality of openings and a plurality of recesses in the dielectric layer, wherein the openings expose the conductive regions, and the recesses are located between the openings;
   forming a conductive layer on the dielectric layer, and filling the openings and the recesses with the conductive layer;
   patterning the conductive layer to form a plurality of strips of first conductive patterns on the dielectric layer and to form a second conductive pattern on a sidewall and a bottom of each of the recesses, wherein the first conductive patterns are connected with each other through the second conductive patterns;
   removing the dielectric layer; and
   removing the second conductive patterns between the first conductive patterns.

2. The method of claim 1, wherein a step of patterning the conductive layer comprises:
   forming a hard mask layer on the conductive layer, the hard mask layer at least covering a portion of the conductive layer located in the recesses;
   performing an etching process with the hard mask layer as a mask; and
   removing the hard mask layer.

3. The method of claim 1, wherein a step of removing the dielectric layer comprises a wet etching process.

4. The method of claim 1, wherein a step of removing the second conductive patterns between the first conductive patterns comprises a dry etching process.

5. The method of claim 1, wherein a material of the conductive layer comprises doped poly-silicon.

6. The method of claim 1, wherein a material of the dielectric layer comprises oxide.

7. The method of claim 1, before forming the dielectric layer, further comprising forming a passivation layer on the substrate.

8. The method of claim 7, wherein a material of the passivation layer comprises nitride.

9. A method of manufacturing a micro electronic mechanical system structure, comprising:
   providing a substrate, wherein the substrate has a plurality of conductive regions;
   forming a dielectric layer on the substrate;
   forming a plurality of openings and a trench in the dielectric layer, wherein the openings expose the conductive regions, and the trench is located between the openings;
   forming a connective layer in the trench;
   forming a conductive layer on the dielectric layer and the connective layer, and filling the openings with the conductive layer;
   patterning the conductive layer to form a plurality of strips of conductive patterns on the dielectric layer and the connective layer, wherein the conductive patterns are connected with each other through the connective layer;
   removing the dielectric layer; and
   removing the connective layer between the conductive patterns.

10. The method of claim 9, wherein a material of the connective layer is different from a material of the dielectric layer.

11. The method of claim 9, wherein a material of the connective layer comprises an insulation material or a conductive material.

12. The method of claim 9, wherein a material of the connective layer comprises silicon nitride, silicon carbide or poly-silicon.

13. The method of claim 9, wherein a material of the connective layer is identical to a material of the conductive layer, and a step of forming the connective layer and a step of forming the conductive layer are performed simultaneously.

14. The method of claim 9, wherein the trench extends from a surrounding of one of the openings to a surrounding of another one of the openings.

15. The method of claim 9, wherein a step of removing the dielectric layer comprises a wet etching process.

16. The method of claim 9, wherein a step of removing the connective layer between the conductive patterns comprises a dry etching process.

17. The method of claim 9, wherein a material of the conductive layer comprises doped poly-silicon.

18. The method of claim 9, wherein a material of the dielectric layer comprises oxide.

19. The method of claim 9, before forming the dielectric layer, further comprising forming a passivation layer on the substrate.

20. The method of claim 19, wherein a material of the passivation layer comprises nitride.

* * * * *